United States Patent
Wang et al.

(10) Patent No.: US 11,630,074 B2
(45) Date of Patent: *Apr. 18, 2023

(54) MEASURING METHOD FOR SEMICONDUCTOR GAS SENSOR BASED ON ALTERNATING-CURRENT IMPEDANCE

(71) Applicant: XI'AN JIAOTONG UNIVERSITY, Shaanxi (CN)

(72) Inventors: Xiaohua Wang, Shaanxi (CN); Dawei Wang, Shaanxi (CN); Aijun Yang, Shaanxi (CN); Mingzhe Rong, Shaanxi (CN); Jianbin Pan, Shaanxi (CN); Xianbo Huang, Shaanxi (CN); Jifeng Chu, Shaanxi (CN); Huan Yuan, Shaanxi (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 78 days.

This patent is subject to a terminal disclaimer.

(21) Appl. No.: 17/317,858

(22) Filed: May 11, 2021

(65) Prior Publication Data

US 2022/0178865 A1 Jun. 9, 2022

(30) Foreign Application Priority Data

Dec. 4, 2020 (CN) ......................... 2020114160603.3

(51) Int. Cl.
    *G01N 27/22* (2006.01)
(52) U.S. Cl.
    CPC .................................. *G01N 27/228* (2013.01)

(58) Field of Classification Search
    CPC .... G01N 27/228; G01N 27/12; G01N 27/028; G01R 27/2605
    See application file for complete search history.

(56) References Cited

U.S. PATENT DOCUMENTS

2006/0102476 A1* 5/2006 Niwa ................. G01N 27/4067
                                                                 204/421

FOREIGN PATENT DOCUMENTS

CN        110573871 A  * 12/2019  ............ F01N 11/007
EP         2154520 A1  *  2/2010  ............. G01N 27/12

* cited by examiner

*Primary Examiner* — Alexander Satanovsky
*Assistant Examiner* — Asm Fakhruddin

(57) ABSTRACT

The present invention discloses a measuring method for a semiconductor gas sensor based on alternating-current impedance. The method includes the steps: connecting the semiconductor gas sensor to a capacitor in parallel, connecting an alternating-current impedance measuring device to the semiconductor gas sensor and the capacitor, combining measuring parameters under measuring frequencies within a first preset range and parallel capacitance values within a second preset range, and measuring a gas with a known concentration according to each of nine features under each combination; traversing all parameter combinations and all the nine features to obtain a plurality of feature values corresponding to the same gas concentration under each feature; and selecting measuring frequencies within a third range, parallel capacitance values within a fourth range and a certain or several of the corresponding features as measuring parameters finally selected for measuring an unknown gas concentration.

8 Claims, 12 Drawing Sheets

MEASURING METHOD FOR SEMICONDUCTOR GAS SENSOR BASED ON ALTERNATING-CURRENT IMPEDANCE

CROSS-REFERENCE TO RELATED APPLICATION

The present application is filed based on and claims priority to Chinese patent application No. CN 2020114160603 filed on Dec. 4, 2020, which is incorporated herein by reference in its entirety.

FIELD

The present invention belongs to the field of semiconductor gas sensor test and in particular relates to a measuring method for a semiconductor gas sensor based on alternating-current impedance.

BACKGROUND

A semiconductor gas sensor particularly represented by a metal oxide gas sensor is low in cost and easy to miniaturize so as to gain more and more attention from people. At present, the semiconductor gas sensor is mainly applied to the field of civil use such as a household gas alarmer and an air quality detector, and if the performances of the semiconductor gas sensor may be further improved, it is possible that the semiconductor gas sensor is applied to the field with higher requirements of an industrial dangerous gas monitor and a chromatograph rear end detector and the like on gas sensitivity.

A common measuring method for an existing semiconductor gas sensor is realized by connecting a gas sensor to a load resistor in series, applying a constant direct-current voltage, and acquiring a partial voltage on the sensor or the load resistor by an analog-digital converter. The measuring method is simple in structure and low in cost, but is poor in output signal linearity, low in signal-to-noise ratio, high in baseline fluctuation, narrow in measuring concentration range and low in restoration speed so as to limit the application range of the semiconductor gas sensor.

Adopted is alternating-current impedance measurement instead of direct-current voltage division measurement. The prior art is mainly focused on situations that some specific semiconductor materials may be improved on sensitivity to a specific to-be-measured gas at a specific alternating-current measuring frequency, the performances of the sensor are not obviously improved, and the method is not popularly adaptive and is only suitable for the semiconductor gas sensor within a very small range.

The above-mentioned information disclosed in the background is merely for enhancement of the understanding of the background of the present invention, and therefore it may contain information that does not form the prior art that is already known in this country to the ordinary skill in the art.

SUMMARY

For solving problems existing in the prior art, the present invention provides a measuring method for a semiconductor gas sensor based on alternating-current impedance. The measuring method is simple and easy and is capable of remarkably improving the output linearity, signal-to-noise ratio, baseline stability, measuring concentration range and restoration speed of the semiconductor gas sensor so as to further improve measuring performances and particular the measuring precision of the semiconductor gas sensor.

The purpose of the present invention is achieved by following technical solutions: a measuring method for a semiconductor gas sensor based on alternating-current impedance includes the following steps:

a first step, connecting the semiconductor gas sensor to a capacitor in parallel, wherein alternating-current impedance features are formed after the semiconductor gas sensor is connected to the capacitor in parallel, and the alternating-current impedance features include the following nine features, Y: a modulus value, obtained by alternating-current impedance measurement, of admittance, $X_1$: a reciprocal of a modulus value, obtained by alternating-current impedance measurement, of a real part of the admittance, G: a modulus value, obtained by alternating-current impedance measurement, of the real part of the admittance, Z: a modulus value, obtained by alternating-current impedance measurement, of impedance, $Z_1$: a modulus value, obtained by alternating-current impedance measurement, of a real part of the impedance, $Y_1$: a reciprocal of the modulus value, obtained by alternating-current impedance measurement, of the real part of the impedance, $Y_2$: a reciprocal of a modulus value, obtained by alternating-current impedance measurement, of an imaginary part of the impedance, phase: a phase obtained by alternating-current impedance measurement, and P: a reciprocal of the phase obtained by alternating-current impedance measurement;

a second step, connecting an alternating-current impedance measuring device to the semiconductor gas sensor and the capacitor, wherein the semiconductor gas sensor measures a target type of gas with a known concentration according to the following way:

combining measuring parameters under measuring frequencies within a first preset range and parallel capacitance values within a second preset range, and measuring a certain type of gas with the known concentration according to each of the nine features under each combination;

after each measurement is ended, obtaining a feature value corresponding to the known concentration under a currently selected certain feature in the nine features;

traversing all parameter combinations and all the nine features to obtain a plurality of feature values corresponding to the same gas concentration under each feature;

in the case that the linearity and signal-to-noise ratio of each of the feature values of all kinds of the features and the known concentration are simultaneously taken into consideration, the linearity is enabled to be greater than or equal to a first threshold and the signal-to-noise ratio is enabled to be greater than or equal to a second threshold:

selecting measuring frequencies within a third range adopting a frequency range formed by corresponding frequency values, wherein a lower limit of the third range is the minimum frequency in the corresponding frequency values, and an upper limit of the third range is the maximum frequency in the corresponding frequencies, selecting parallel capacitance values within a fourth range adopting a capacitance range formed by corresponding parallel capacitance values, wherein a lower limit of the fourth range is the minimum capacitance value in the corresponding parallel capacitance values, and an upper limit of the fourth range is the maximum capacitance value in the corresponding parallel capacitance values, selecting a certain or several of the corresponding features, and taking the selected measuring frequencies within the third range, the selected parallel capacitance values within the fourth range and the selected certain or several of the corresponding features as finally selected measuring parameters for measuring an unknown gas concentration; and a third step, measuring the type of gas with an unknown concentration based on the measuring parameters.

In the method, the step that the linearity and signal-to-noise ratio of each of the feature values of all kinds of the features and the known concentration are simultaneously taken into consideration, the linearity is enabled to be greater than or equal to a first threshold and the signal-to-noise ratio is enabled to be greater than or equal to a second threshold includes:

1) firstly, screening all the feature values with the linearity being greater than or equal to the first threshold and each of the features corresponding to the feature values; and then, further selecting the feature values with the signal-to-noise ratios being greater than or equal to the second threshold and each of the features corresponding to the feature values from the feature values;

or, 2) firstly, screening all the feature values with the signal-to-noise ratios being greater than or equal to the second threshold and each of the features corresponding to the feature values; and then, further selecting the feature values with the linearity being greater than or equal to the first threshold and each of the features corresponding to the feature values from the feature values.

In the method, in the first step, the semiconductor gas sensor is connected to a heating voltage, and the semiconductor gas sensor includes a metal oxide gas sensor.

In the method, in the second step, the first preset range is 1 Hz to 100 MHz, and the second preset range is 0 pF to 100 uF.

In the method, in the second step, the alternating-current impedance measuring device includes an impedance analyzer, a vector network analyzer, an electrical bridge, an impedance measuring chip and other apparatuses with impedance measuring functions.

In the method, in the second step, measuring precision is further inspected as another dimension for finally selecting the measuring parameters for measuring the unknown gas concentration.

In the method, a strategy for determining the measuring parameters represented by the measuring frequencies within the third range, the parallel capacitance values within the fourth range and the features is that: firstly, the feature values with the linearity being greater than or equal to the first threshold are selected, then, the feature values with the signal-to-noise ratios being greater than or equal to the second threshold and the features corresponding to the feature values are screened from the feature values, and finally, the feature values with the measuring frequencies being located within the optimal measuring precision range of the impedance measuring device are selected and taken as the finally screened feature values, the measuring frequencies within the third range adopting a frequency range formed by the frequency values corresponding to the finally screened feature values are selected, the parallel capacitance values within the fourth range adopting a capacitance range formed by the parallel capacitance values corresponding to the finally screened feature values are selected, a certain or several of the corresponding features are selected, and the selected measuring frequencies within the third range, the selected parallel capacitance values within the fourth range and the selected certain or several of the corresponding features are taken as the finally selected measuring parameters for measuring the unknown gas concentration.

In the method, another strategy for determining the measuring parameters represented by the measuring frequencies within the third range, the parallel capacitance values within the fourth range and the features is that: firstly, the feature values with the signal-to-noise ratios being greater than or equal to the second threshold are selected, then, the feature values with the linearity being greater than or equal to the first threshold and the features corresponding to the feature values are screened from the feature values, and finally, the feature values with the measuring frequencies being located within the optimal measuring precision range of the impedance measuring device are selected and taken as the finally screened feature values, the measuring frequencies within the third range adopting a frequency range formed by the frequency values corresponding to the finally screened feature values are selected, the parallel capacitance values within the fourth range adopting a capacitance range formed by the parallel capacitance values corresponding to the finally screened feature values are selected, a certain or several of the corresponding features are selected, and the selected measuring frequencies within the third range, the selected parallel capacitance values within the fourth range and the selected certain or several of the corresponding features are taken as the finally selected measuring parameters for measuring the unknown gas concentration.

Beneficial Effects:

By using the measuring method provided by the present invention, the output linearity, signal-to-noise ratio, baseline stability, measuring concentration range and restoration speed of the semiconductor gas sensor may be remarkably improved by determining the measuring parameters during gas measurement.

The above-mentioned description is merely a summary of the technical solutions of the present invention. In order to make technical means of the present invention clearer and more understandable to reach the level that the technical solutions can be implemented by the skilled in the art according to the content of the description, and in order to make the above-mentioned and other purposes, characteristics and advantages of the present invention more obvious and understandable, specific implementation ways of the present invention are illustrated below.

BRIEF DESCRIPTION OF THE DRAWINGS

By reading detailed description in the specific implementation ways preferred hereunder, various other advantages and benefits of the present invention will become clear for the ordinary skill in the art. Accompanying drawings of the description are merely intended to illustrate the preferred implementation ways, rather than to limit the present invention. Obviously, the accompanying drawings described below are merely some embodiments of the present invention, and other accompanying drawings may be obtained without creative work by the ordinary skill in the art according to these accompanying drawings. Moreover, in the overall accompanying drawings, the same components are denoted by the same reference symbols of the accompanying drawings.

In the accompanying drawings.

Figure 1:
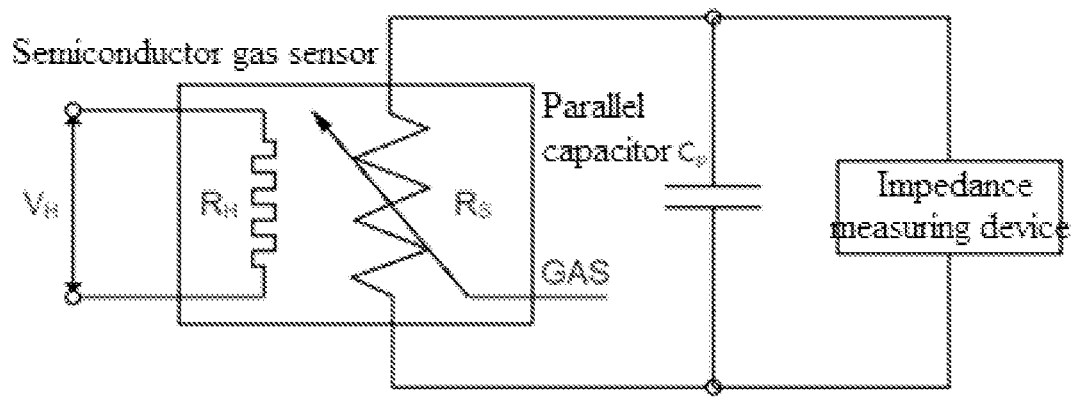
FIG. 1 is a schematic diagram showing a circuit provided by the present invention, wherein an application circuit for a heating voltage of a semiconductor gas sensor and a subsequent processing circuit for an impedance measurement result are omitted in the diagram.
Figure 2:
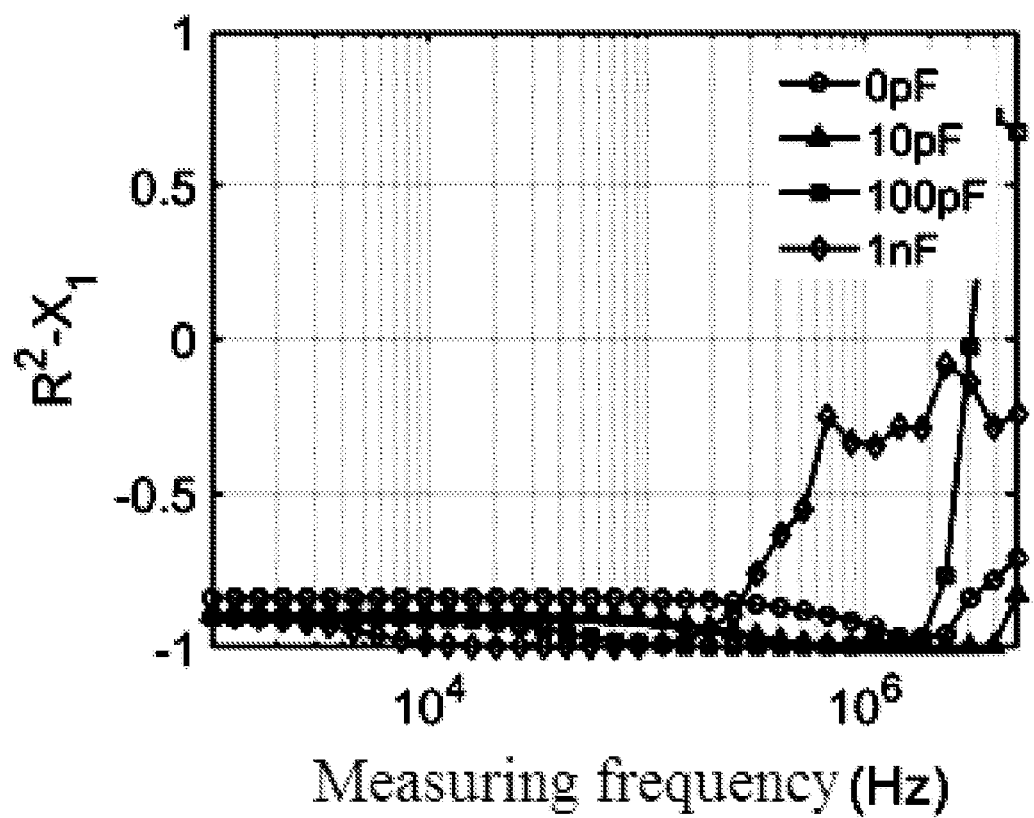
FIG. 2(a) to FIG. 2(i) are diagrams showing gas concentration-measuring feature linearity relationships under different parallel capacitance values and different measuring frequencies when nine alternating-current impedance features provided by the present invention are respectively used as measuring features, wherein vertical coordinates represent correlated coefficients $R^2$, and the closer the absolute values of the correlated coefficients are to 1, the better the linearity.
Figure 2:
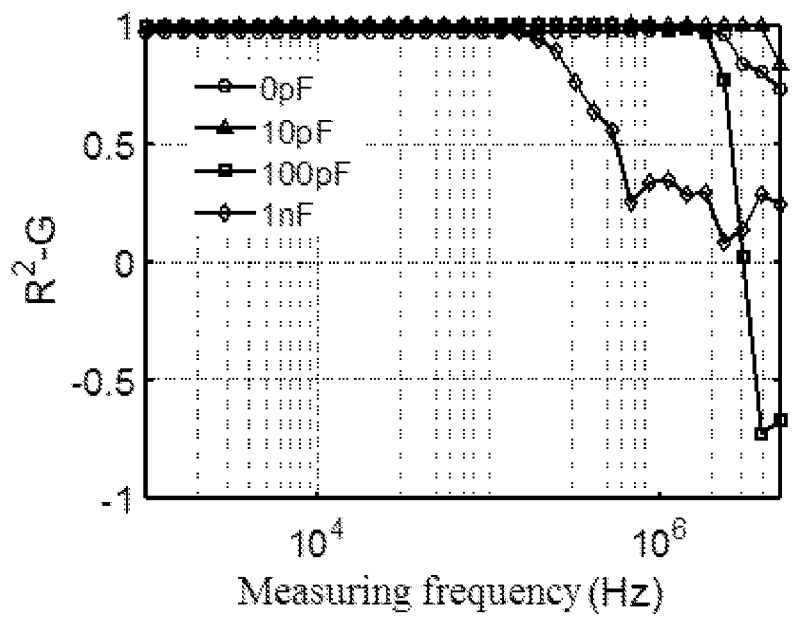
Figure 2:
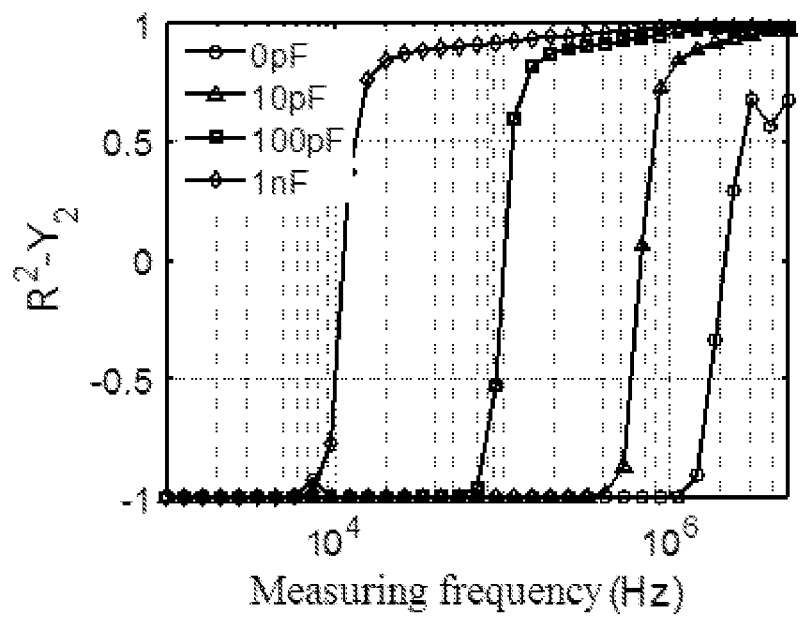
Figure 2:
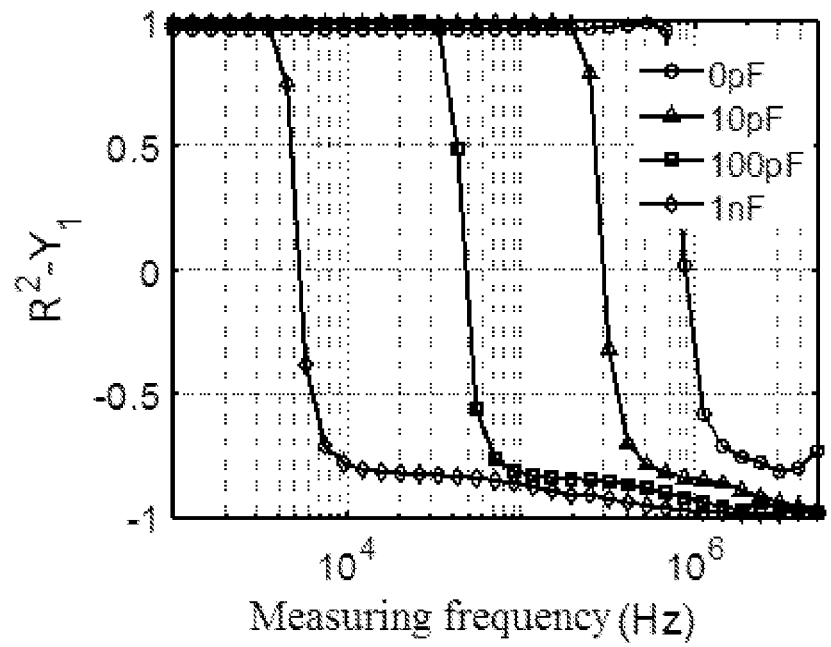
Figure 2:
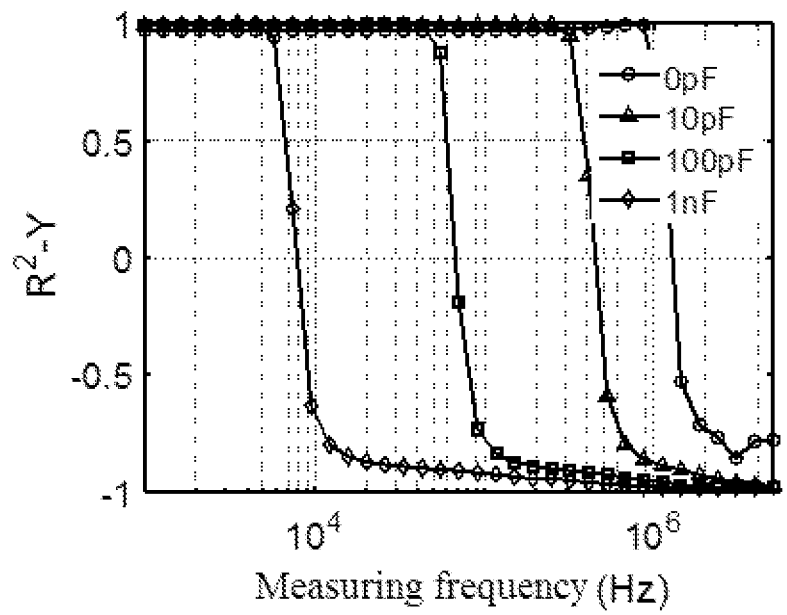
Figure 2:
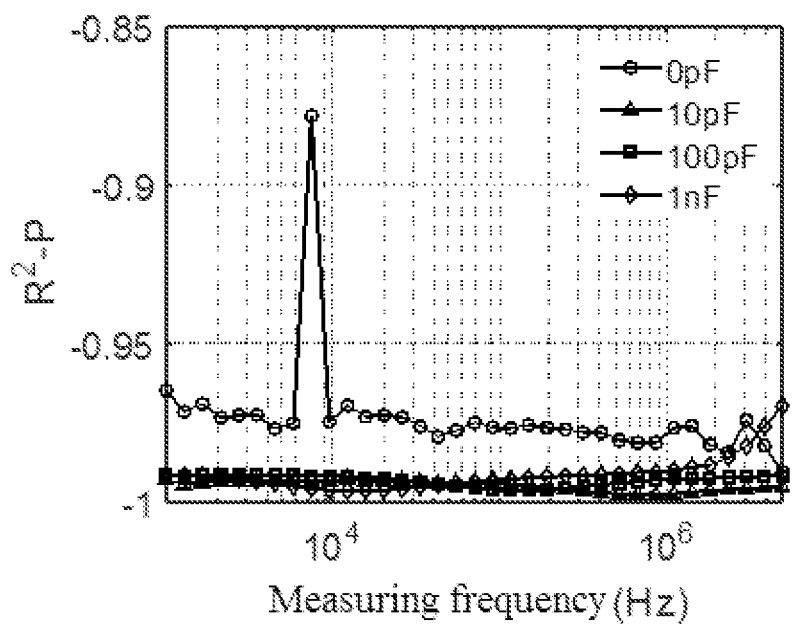
Figure 2:
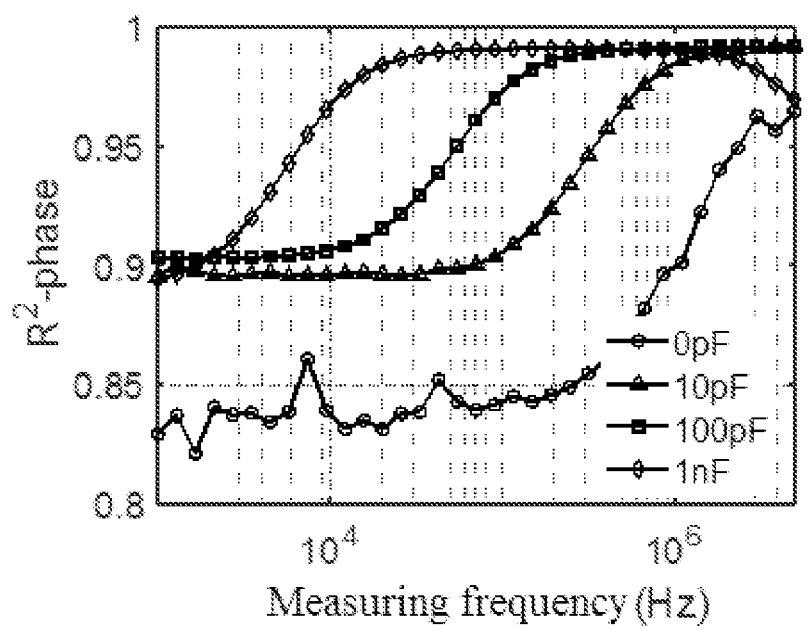
Figure 2:
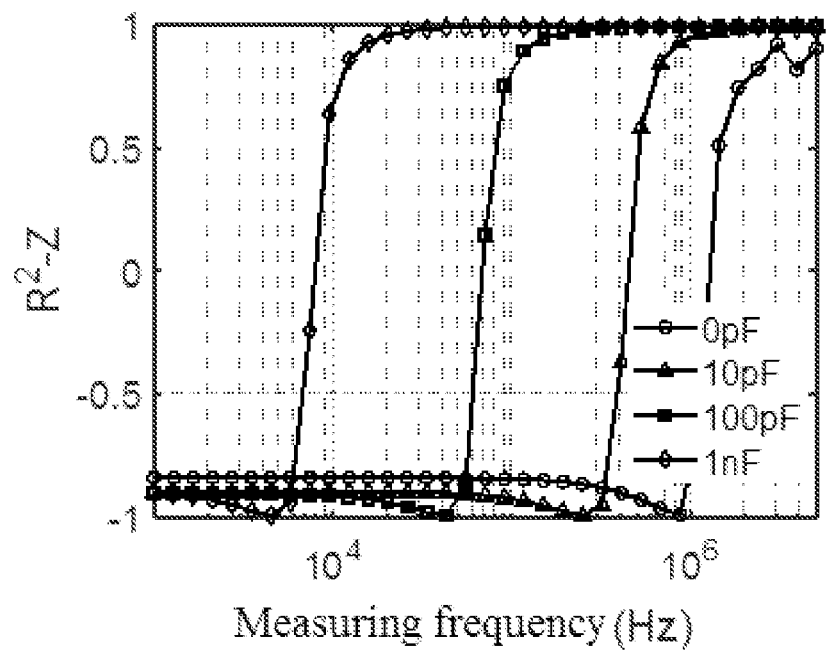
Figure 2:
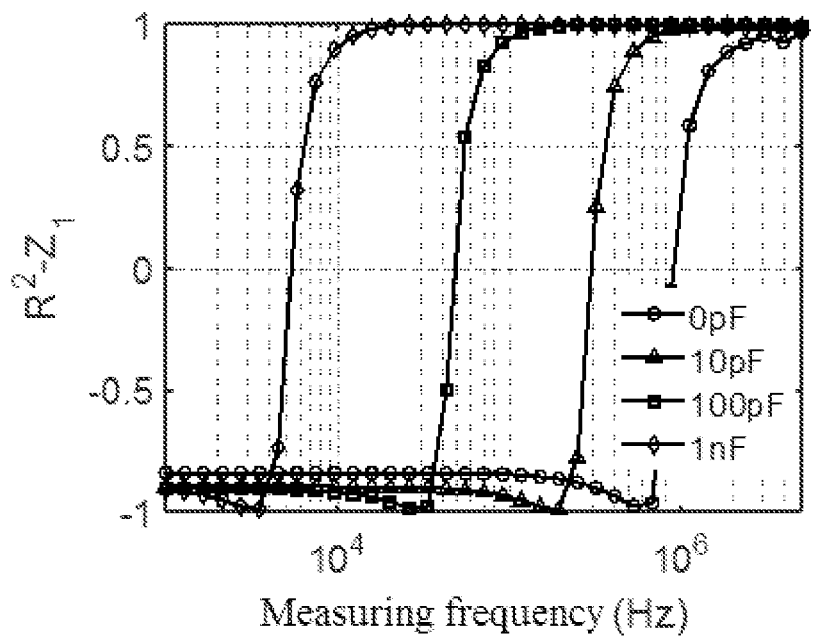

The present invention is further explained below in combination with the accompanying drawings and embodiments.

DETAILED DESCRIPTION OF THE EMBODIMENTS

Specific embodiments of the present invention will be described in more detail below with reference to accompanying drawings 1 to 7(b). Although the specific embodiments of the present invention are shown in the accompanying drawings, it should be understood that the present invention can be implemented in various forms, but should not be restricted by the embodiments described herein. On the contrary, these embodiments are provided for more thoroughly understanding the present invention and completely communicating the scope of the present invention to those skilled in the art.

It should be noted that certain vocabularies are used in the description and claims to designate specific components. It should be understood by the skilled in the art that the same component can be called with different nouns by technicians. In the description and claims, differences of the nouns are not used as ways of distinguishing the components, but functional differences of the components are used as distinguishing criteria. For example, "include" or "including" mentioned in the overall description and claims is an open-type word so as to be explained as "including, but not limited". Preferred implementation ways for implementing the present invention are subsequently described in the description, however, the description is made for the purpose of illustrating general principles of the description, rather than limiting the scope of the present invention. The protective scope of the present invention should be subject to that defined by appended claims.

In order to facilitate understanding the embodiments of the present invention, the specific embodiments serving as examples are further described below in combination with the accompanying drawings, and the embodiments of the present invention are not limited by each of the accompanying drawings.

In a measuring method for a semiconductor gas sensor based on alternating-current impedance, the semiconductor gas sensor is connected to a capacitor in parallel, alternating-current impedance features are formed after the semiconductor gas sensor is connected to the capacitor in parallel, and the overall alternating-current impedance features formed after the semiconductor gas sensor is connected to the capacitor in parallel are measured. One of the alternating-current impedance features is required to be selected as a measuring feature for characterizing a gas concentration, and the alternating-current impedance features which are possible to be used as measuring features in the present invention include:

Y: a modulus value, obtained by alternating-current impedance measurement, of admittance, $X_1$: a reciprocal of a modulus value, obtained by alternating-current impedance measurement, of a real part of the admittance, G: a modulus value, obtained by alternating-current impedance measurement, of the real part of the admittance, Z: a modulus value, obtained by alternating-current impedance measurement, of impedance, $Z_1$: a modulus value, obtained by alternating-current impedance measurement, of a real part of the impedance, $Y_1$: a reciprocal of the modulus value, obtained by alternating-current impedance measurement, of the real part of the impedance, $Y_2$: a reciprocal of a modulus value, obtained by alternating-current impedance measurement, of an imaginary part of the impedance, phase: a phase obtained by alternating-current impedance measurement, and P: a reciprocal of the phase obtained by alternating-current impedance measurement.

Measuring frequencies within a first preset range, parallel capacitance values within a second preset range and the nine impedance features which are possible to be used as measuring features for characterizing the gas concentration in the present invention are provided, and one of the alternating-current impedance features is finally required to be preferred as the measuring feature which is a measuring parameter required to be determined by experiments in the measuring method provided by the present invention.

The three measuring parameters including the measuring frequencies, the parallel capacitance values and a certain alternating-current impedance feature serving as the measuring feature mentioned in the second step are determined by an experiment that all possible measuring parameters are permuted and combined. Specific steps are described as follows: the semiconductor gas sensor is exposed in a series of to-be-detected gases with preset concentrations; the overall alternating-current impedance features formed after the semiconductor gas sensor is connected to the capacitor in parallel are measured based on the measuring frequencies within the first preset range and the parallel capacitance values within the second preset range; and gas concentration-measuring feature linearity relationships and response amplitudes such as signal-to-noise ratios of the measuring features under the measuring frequencies within the first preset range, the parallel capacitance values within the second preset range and the nine alternating-current impedance features respectively used as the measuring features are calculated according to an experimental result.

In another embodiment, a strategy for determining the measuring parameters represented by the measuring frequencies within the third range, the parallel capacitance values within the fourth range and the features is that: firstly, feature values with linearity being greater than or equal to a first threshold are selected, then, feature values with signal-to-noise ratios being greater than or equal to a second threshold and the features corresponding to the feature values are screened from the feature values, and finally, feature values with measuring frequencies being located within an optimal measuring precision range of an impedance measuring device are selected and taken as finally screened feature values, the measuring frequencies within the third range adopting a frequency range formed by the frequency values corresponding to the finally screened feature values are selected, wherein a lower limit of the third range is the minimum frequency in the corresponding frequency values, and an upper limit of the third range is the maximum frequency in the corresponding frequencies, the parallel capacitance values within the fourth range adopting a capacitance range formed by the parallel capacitance values corresponding to the finally screened feature values are selected, wherein a lower limit of the fourth range is the minimum capacitance value in the corresponding parallel capacitance values, and an upper limit of the fourth range is the maximum capacitance value in the corresponding parallel capacitance values, a certain or several of the corresponding features are selected, and the selected measuring frequencies within the third range, the selected parallel capacitance values within the fourth range and the selected certain or several of the corresponding features are taken as the finally selected measuring parameters for measuring the unknown gas concentration.

Or, another strategy is that:

firstly, feature values with signal-to-noise ratios being greater than or equal to a second threshold are selected, then, feature values with linearity being greater than or equal to the first threshold and features corresponding to the feature values are screened from the feature values, and finally, feature values with measuring frequencies being located within an optimal measuring precision range of an impedance measuring device are selected and taken as finally screened feature values, the measuring frequencies within the third range adopting a frequency range formed by the frequency values corresponding to the finally screened feature values are selected, the parallel capacitance values within the fourth range adopting a capacitance range formed by the parallel capacitance values corresponding to the finally screened feature values are selected, a certain or several of the corresponding features are selected, and the selected measuring frequencies within the third range, the selected parallel capacitance values within the fourth range and the selected certain or several of the corresponding features are taken as the finally selected measuring parameters for measuring the unknown gas concentration.

Wherein such an information about the optimal measuring precision range belongs to factory information of the corresponding alternating-current impedance measuring device and/or semiconductor gas sensor.

In a preferred implementation way of the method, in the first step, the semiconductor gas sensor is connected to a heating voltage, the heating voltage may be or not be a direct-current voltage, and the semiconductor gas sensor includes a metal oxide gas sensor.

In a preferred implementation way of the method, in the second step, the first preset range is 0 Hz to 100 MHz, wherein 0 Hz described herein is used for indicating an ultralow frequency; and the second preset range is 0 pF to 100 uF, wherein 0 pF corresponds to a situation that no parallel capacitor is connected, this is because parasitic capacitance values of some semiconductor gas sensors or circuit boards are relatively great, these parasitic capacitors play roles similar to those of the parallel capacitor, and in this case, the parallel capacitor is not needed to be connected.

In a preferred implementation way of the method, in the second step, the alternating-current impedance measuring device includes an impedance analyzer, a vector network analyzer, an electrical bridge, a chip with an impedance measuring function and other apparatuses with impedance measuring functions.

In a preferred implementation way of the method, the mentioned three measuring parameters including the measuring frequencies, the parallel capacitance values and a certain alternating-current impedance feature serving as the measuring feature are determined by an experiment that all the possible measuring parameters are permuted and combined. The semiconductor gas sensor is exposed in a series of to-be-detected gases with preset concentrations; the overall alternating-current impedance features formed after the semiconductor gas sensor is connected to the capacitor in parallel are measured based on the measuring frequencies within the first preset range and the parallel capacitance values within the second preset range; and gas concentration-measuring feature linearity relationships and signal-to-noise ratios of the measuring features under the measuring frequencies within the first preset range, the parallel capacitance values within the second preset range and the nine alternating-current impedance features respectively used as the measuring features are calculated according to an experimental result. A strategy for determining the three measuring parameters including the measuring frequencies, the parallel capacitance values and the measuring features is that: firstly, measuring parameter combinations with high enough gas concentration-measuring feature linearity are selected; then, parameter combinations of which the measuring features have high signal-to-noise ratios are screened from the measuring parameter combinations; and finally, parameter combinations of which the measuring frequencies are located within the optimal measuring precision range of the impedance measuring device are selected.

In order to further understand the present invention, following embodiments are described.

Embodiment 1

The method includes:

step 1, in the present embodiment, a metal oxide gas sensor TGS2611 and $CH_4$ (methane) are adopted as examples, an equivalent circuit shown in FIG. 1 is constructed, the impedance measuring device is an impedance analyzer IM3570, the parallel capacitor is a chip capacitor 0805, and the candidate capacitance values are 0 pF, 10 pF, 100 pF and 1 nF. For the present embodiment, a capacitor of which the value ranging from 0 pF to 1 nF is capable of meeting a measuring requirement. For other cases, it is possible that more capacitance values are selected between 0 pF and 100 uF so as to conduct an experiment;

step 2, the impedance analyzer IM3570 is connected to the sensor TGS2611 and the parallel capacitor; and step 3, with a parallel capacitor of 1 nF as an example, the following processes are repeated under different parallel capacitance values.

A circuit board of the sensor TGS2611 in the step 1 is placed in a gas measuring chamber, and meanwhile, the equivalent circuit in the step 2 is kept to be connected. The gas measuring chamber has a volume of 300 ml, is introduced with air as a background gas and is kept at the constant temperature of 26.5 DEG C. and the constant humidity of 0% RH, the flow rate of the introduced air is 1000 ml/min, after the sensor TGS2611 is sufficiently aged and stabilized, a standard gas of methane is started to be introduced, air introduction is set as alternate input of the standard gas of methane and the background gas with each respectively lasting for 5 min, and the standard gas of methane sequentially has the concentration values of 12.5 ppm, 25 ppm, 37.5 ppm, 50 ppm, 62.5 ppm, 75 ppm, 87.5 ppm and 100 ppm. Meanwhile, the impedance analyzer IM3570 is set in a continuous frequency sweep mode, is capable of scanning 45 frequency points every 5 s and has frequencies ranging from 1000 Hz to 5 MHz so as to realize continuous measurement.

Figure 3:
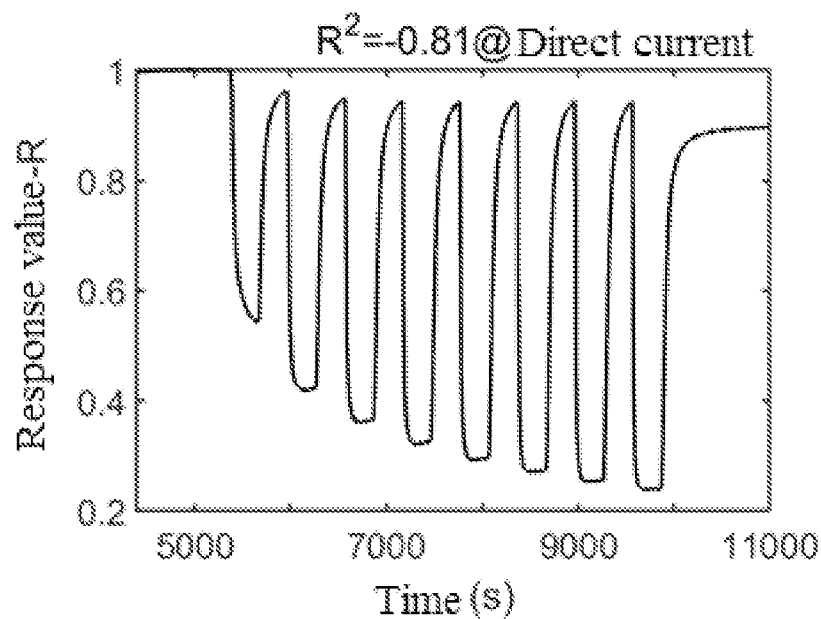
FIG. 3(a) to FIG. 3(e) are schematic diagrams showing results obtained by measuring methane ($CH_4$) by virtue of a commercial semiconductor gas sensor TGS2611 by using a method provided by the present invention, wherein in the diagrams, R and G (conductance) are results obtained by traditional direct-current voltage division measurement, Y, $Y_1$ and $Y_2$ are the measuring features provided by the present invention, and it may be seen that measuring performances of the semiconductor gas sensor TGS2611 for $CH_4$ are remarkably improved in terms of output linearity, signal-to-noise ratio, baseline stability, measuring concentration range and restoration speed after the measuring method provided by the present invention is used.
Figure 3:
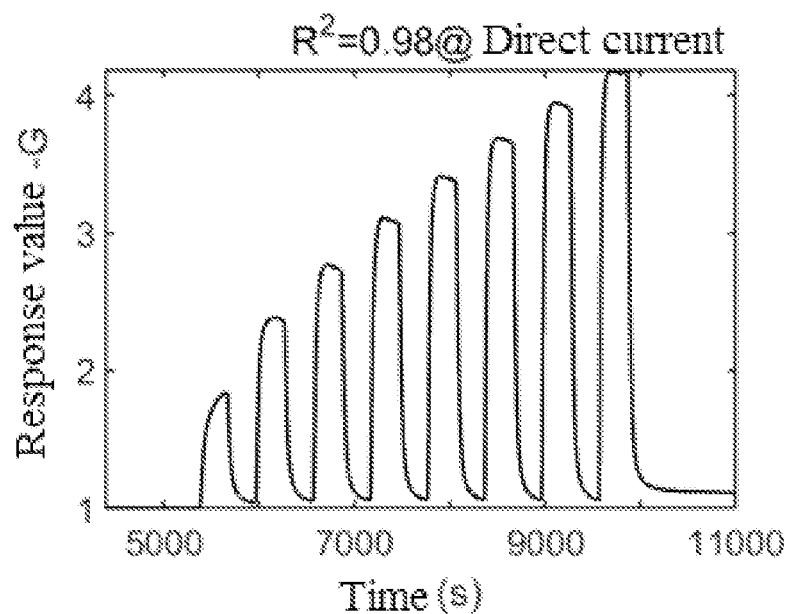
Figure 3:
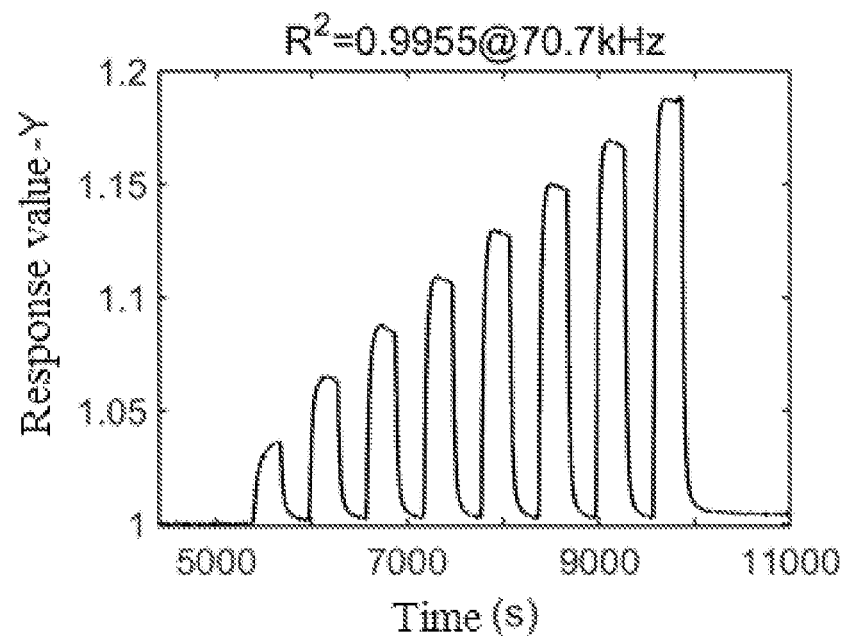
Figure 3:
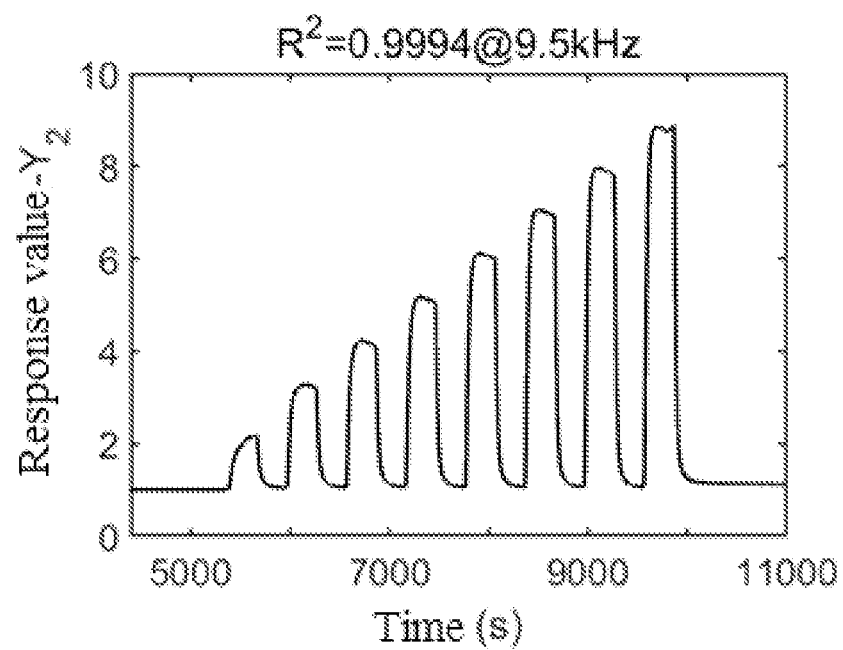
Figure 3:
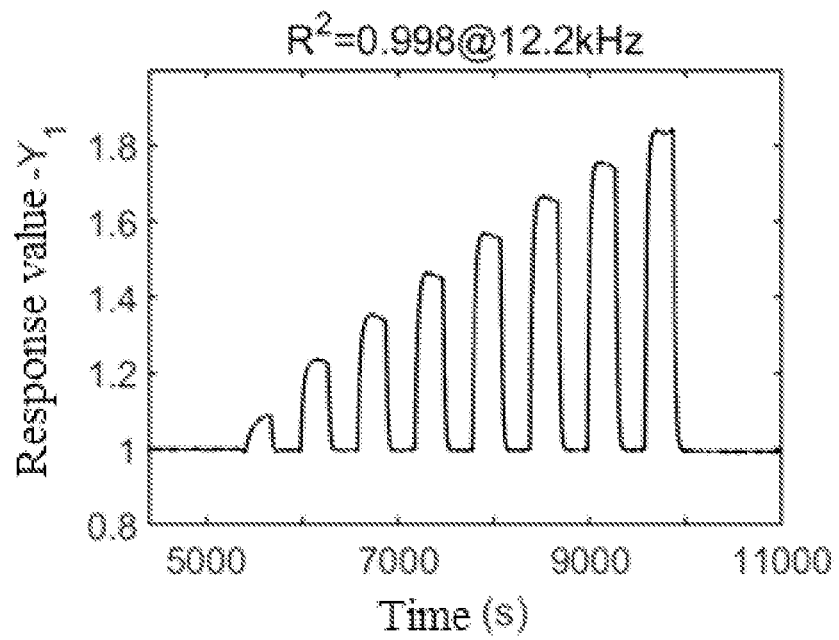

Collected data is processed to obtain the gas concentration-measuring feature linearity relationships of the nine impedance features serving as the measuring features under the different parallel capacitance values and the different measuring frequencies, as shown in FIG. 2(a) to FIG. 2(i), and parallel capacitance value-impedance feature-measuring frequency combinations of which the linearity coefficient has the absolute value $|R^2|$ being greater than 0.995 are screened. It is found that the absolute value $|R^2|$ of the linearity coefficient is possible to be greater than 0.995 when only three impedance features Y, $Y_1$ and $Y_2$ are used as the measuring features in the nine impedance features, at the moment, the measuring parameter combinations are that: the absolute value of the gas concentration-measuring feature linearity coefficient of the impedance feature Y under the parallel capacitance of 100 pF and the measuring frequency of 70.7 kHz is 0.9955; the absolute value of the gas concentration-measuring feature linearity coefficient of the impedance feature $Y_2$ under the parallel capacitance of 100 pF and the measuring frequency of 9.5 kHz is 0.9994; and the absolute value of the gas concentration-measuring feature linearity coefficient of the impedance feature $Y_1$ under the parallel capacitance of 100 pF and the measuring frequency of 12.2 kHz is 0.998. Response value-time relation curves of the sensor under these measuring parameter combinations are shown as FIG. 3(c) to FIG. 3(e), a response value of the sensor described herein is defined as a ratio of a value of a measuring feature under the condition that there is a to-be-detected gas to a value of a measuring feature under the condition that there is no to-be-detected gas, and therefore, when the concentration of the to-be-detected gas is 0, the response value of the sensor is 1, that is, there is no response. Herein, the signal-to-noise ratio of the gas sensor is defined as a value obtained in a way that an absolute value of a difference of the response value of the sensor and 1 is divided by a noise amplitude, the signal-to-noise ratio of the measuring feature $Y_2$ in the present embodiment may be calculated to be 1600 (the noise amplitude of $Y_2$ is about 0.5%, and the response value is about 9 under 100 ppm methane), the signal-to-noise ratio of the measuring feature Y is about 120 (the noise amplitude of Y is about 0.15%, and the response value is about 1.18 under 100 ppm methane), and the signal-to-noise ratio of the measuring feature $Y_1$ is about 160 (the noise amplitude of $Y_1$ is about 0.5%, and the response value is about 1.8 under 100 ppm methane). Since the signal-to-noise ratio of the measuring feature $Y_2$ used as the measuring feature is the highest, the impedance feature $Y_2$, the parallel capacitance of 100 pF and the measuring frequency of 9.5 kHz are the optimal measuring parameters in the method provided by the present invention. FIG. 3(a) to FIG. 3(b) show results measured by using a traditional direct-current voltage division method, and it may be seen that the measuring method provided by the present invention is remarkably improved on the output linearity of the sensor (the absolute value of $R^2$ is increased from the optimal value 0.98 obtained by using the traditional direct-current voltage division method to 0.995 or above); in the aspect of a signal-to-noise ratio, the optimal signal-to-noise ratio obtained by using the traditional direct-current voltage division method is 160, while the signal-to-noise ratio obtained by using the method provided by the present invention is 1600 so as to be remarkably increased; meanwhile, the output baseline stability of the sensor in the method provided by the present invention is also remarkably higher than that of the traditional method, and the fluctuation amplitude is less; when the background gas is introduced to restore the sensor every time, the output of the sensor may be rapidly restored to a position near a baseline (within 5 min) by using the method provided by the present invention, while the output of the sensor may not be restored to the position near the baseline within 5 min by using the traditional direct-current voltage division method; and in the aspect of a measuring concentration range, by using the method provided by the present invention, the output linearity of the sensor is high, and therefore, there is no saturation phenomenon in the case of methane with the concentration of 100 ppm, while the output saturation phenomenon of the sensor is obvious in the traditional direct-current voltage division method, and therefore, the gas concentration range which may be measured in the present invention is wider.

Figure 4:
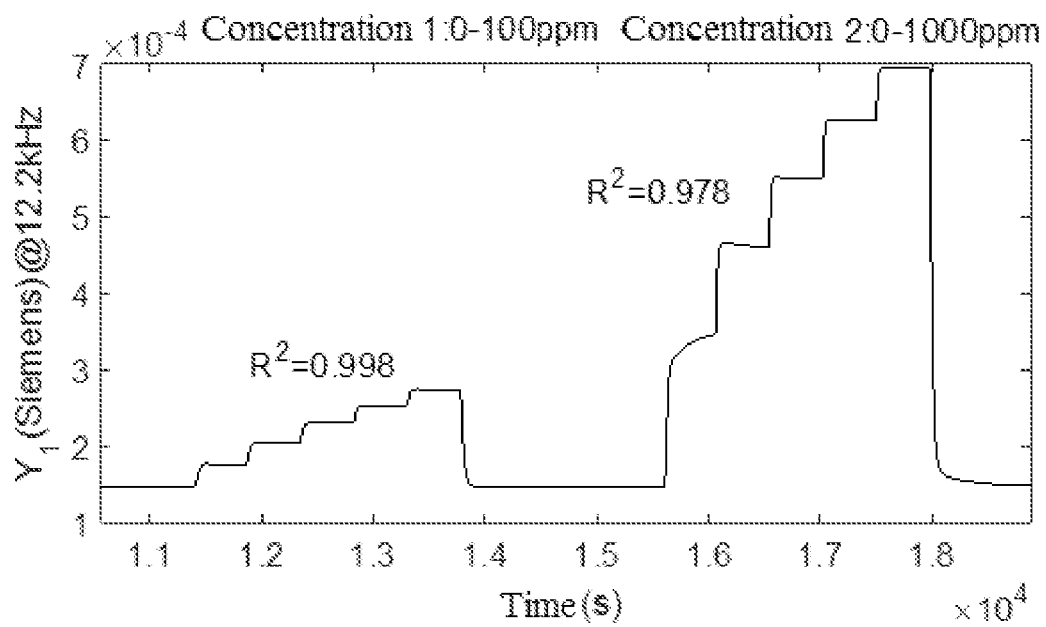
FIG. 4(a) to FIG. 4(b) are schematic diagrams showing results obtained by measuring $CH_4$ within different concentration ranges by virtue of the semiconductor gas sensor TGS2611 by using the method provided by the present invention, wherein in the diagrams, the linearity of $Y_2$ within the different concentration ranges has little change, while $Y_1$ has greater change.
Figure 4:
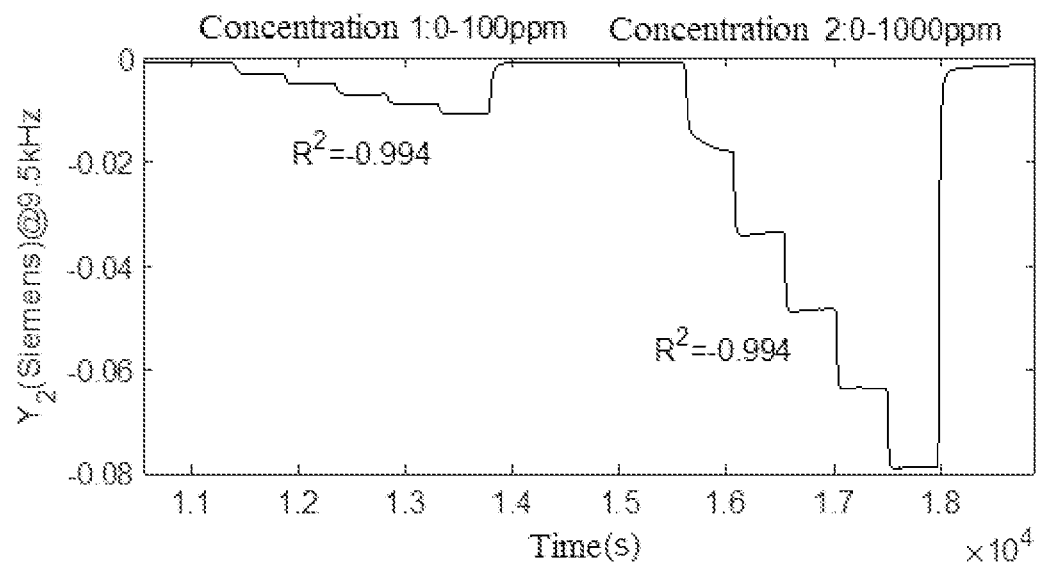

As shown in FIG. 4(a) to FIG. 4(b), $Y_1$ and $Y_2$ are the impedance features provided by the present invention, keeping situations of the gas concentration-measuring feature linearity relationships under a test across concentration ranges of 0-100 ppm and 0-1000 ppm are compared when the different impedance features are used as the measuring features, wherein $Y_2$ shows an almost unchanged linearity relationship within the two concentration ranges, and therefore, when gases with different concentrations are measured, the measuring frequencies are not required to be changed, and the linearity may also be kept almost unchanged; and when $Y_1$ is used as a measuring feature, the gas concentration-measuring feature linearity relationship is remarkably changed ($R^2$ is changed from 0.998 to 0.978), which means that the linearity relationships may be kept unchanged by changing the measuring frequencies when the gases with the different concentrations are measured, and therefore, difficulty is brought for actual application.

Figure 5:
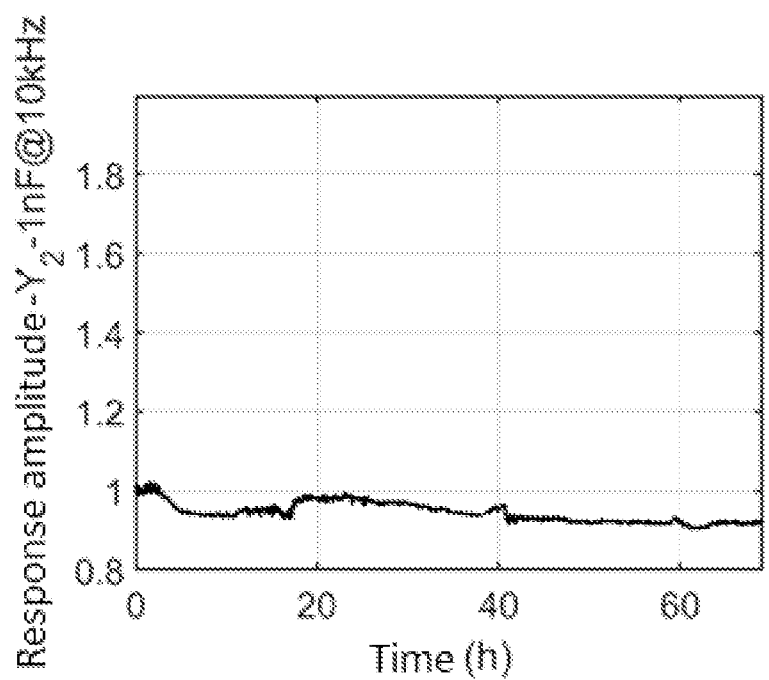
FIG. 5(a) to FIG. 5(b) are measurement results obtained by exposing the semiconductor gas sensor TGS2611 in the same air environment in a laboratory for 69 h by using a traditional resistance measuring method and the method provided by the present invention, wherein the measurement results are used for evaluating the stability of a sensor reading baseline obtained by using the different measuring methods, and the laboratory has the temperature fluctuated between 22 DEG C. and 27 DEG C. and the humidity fluctuated between 50% RH and 70% RH.
Figure 5:
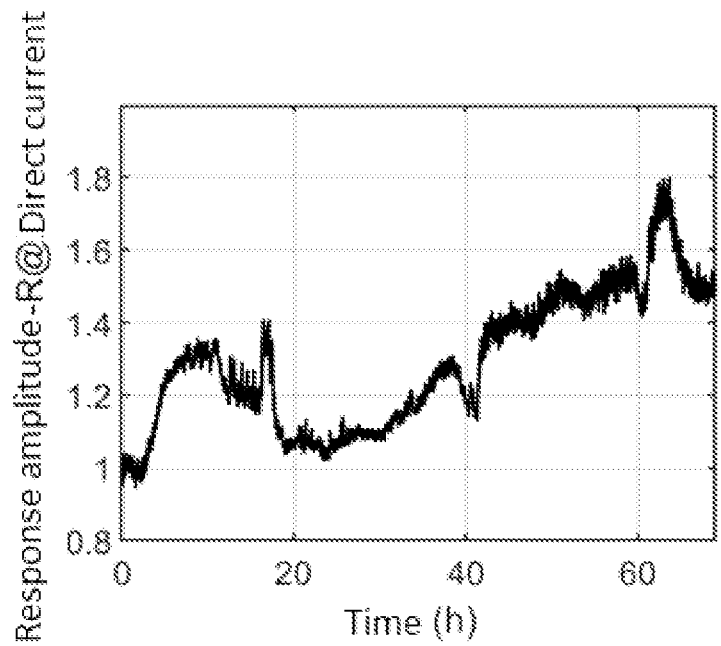

As shown in FIG. 5(a) to FIG. 5(b), measurement is realized by performing exposure in a laboratory environment for 69 h, and the baseline fluctuation of a measurement result obtained by traditional resistance measurement is remarkably stronger than that of $Y_2$ obtained by using the measuring method provided by the present invention.

The impedance feature $Y_2$ in the present invention is capable of realizing the linear output of the sensor under a lower measuring frequency. For the impedance measuring device, the measuring device is capable of achieving higher measuring precision under the lower measuring frequency and is most possible to work within an optimal measuring frequency range of the impedance measuring device. For the gases within the different concentration ranges, $Y_2$ is capable of achieving good linearity without changing the measuring frequency, and therefore, for gas measurement within unknown concentration ranges, it is easier for $Y_2$ to achieve the good linearity, $Y_2$ serving as a measuring feature makes the response value of the sensor higher, and therefore, a higher signal-to-noise ratio may be obtained.

Embodiment 2

The nine impedance features provided by the present invention are used as candidate measuring features and are also taken as emphasis of the present disclosure. Since an alternating-current impedance method is adopted as the prior art for measuring the semiconductor gas sensor, however, an imaginary part and a real part of impedance are generally adopted as measuring features in these reports, while performance research on other features, as measuring features, of the impedance is ignored, in fact, there will be remarkable performance differences among different impedance features serving as the measuring features. In the present embodiment, the great importance of choice of the measuring features is described by comparing performance differences when impedance features including a reciprocal ($Y_2$) of a modulus value of the imaginary part of the impedance and the modulus value ($Z_2$) of the imaginary part of the impedance, which seem to have no great differences, but actually have huge performance differences, are respectively used as the measuring features.

The corresponding optimal measuring frequency and parallel capacitance value adopted when $Z_2$ and $Y_2$ are respectively used as the measuring features are found in the experimental steps in embodiment 1. A commercial semiconductor gas sensor TGS2600 is adopted herein, a to-be-detected gas is acetone (with concentration of 40 ppm, 80 ppm, 120 ppm, 160 ppm and 200 ppm), the ambient humidity is 37% RH, and the temperature is 28 DEG C.

Figure 6:
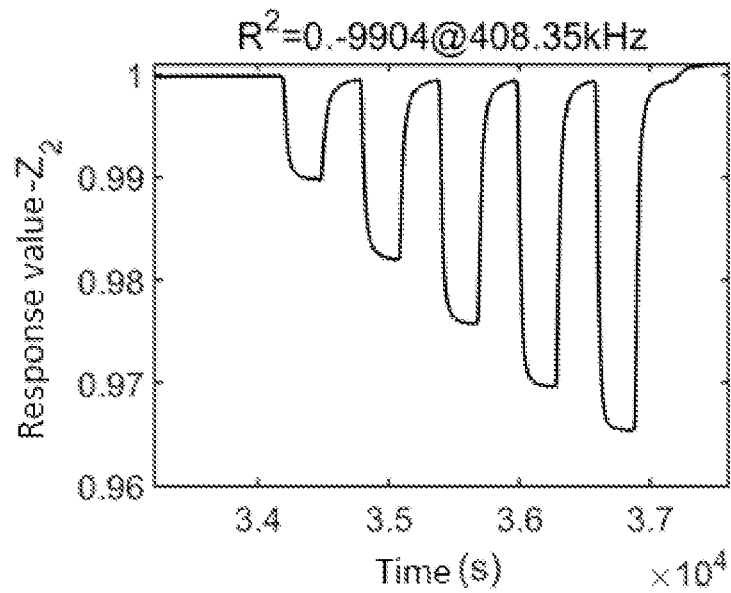
FIG. 6(a) to FIG. 6(b) are response value images under the optimal measuring frequency and parallel capacitance when $Z_2$ and $Y_2$ are respectively adopted as the measuring features, wherein a commercial semiconductor gas sensor TGS2600 is adopted herein, a to-be-detected gas is acetone (with concentration of 40 ppm, 80 ppm, 120 ppm, 160 ppm and 200 ppm), the ambient humidity is 37% RH, and the temperature is 28 DEG C.
Figure 6:
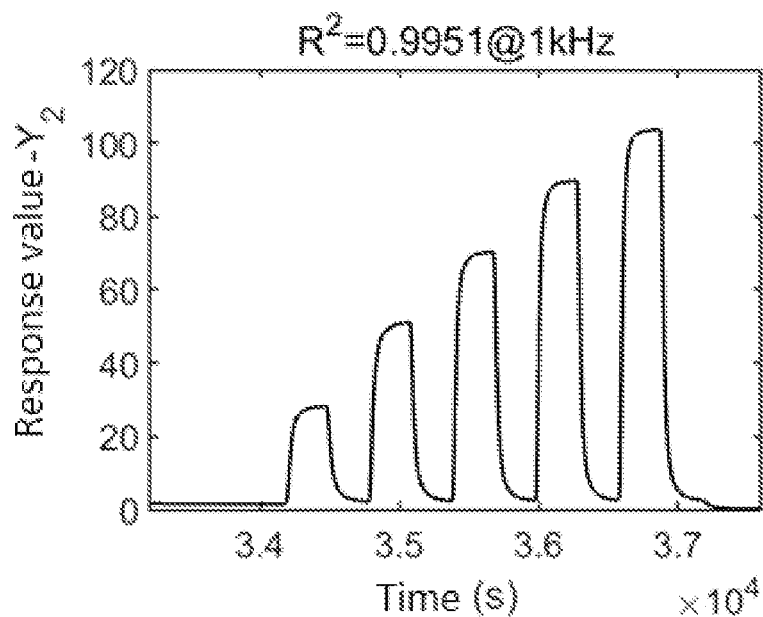

As shown in FIG. 6(a) to FIG. 6(b), $Z_2$ has the optimal measuring frequency of 408.35 kHz and the parallel capacitance value of 1 nF, and the signal-to-noise ratio of $Z_2$ is about 1750 (the response value is 0.965, and the noise amplitude is 0.002%) when acetone with the concentration of 200 ppm is adopted; $Y_2$ has the optimal measuring frequency of 1 kHz and the parallel capacitance value of 1 nF, and the signal-to-noise ratio of $Y_2$ is about 20480 (the response value is 103.4, and the noise amplitude is 0.5%) when acetone with the concentration of 200 ppm is adopted; and the signal-to-noise ratio and the response value mentioned herein are defined to be same as those in embodiment 1. Known by comparing FIG. 6(a) with FIG. 6(b), under the premise that the absolute value of the gas concentration-measuring feature linearity coefficient is greater than 0.99, the measuring frequency required by $Z_2$ is up to 408.35 kHz, but the measuring frequency required by $Y_2$ is only 1 kHz. An existing commercially available chip with an impedance measuring function may achieve the maximum measuring frequency of 200 kHz (a chip AD5940 produced by the ADI), which means that if $Z_2$ is adopted as the measuring feature, it is impossible that an impedance measuring chip is adopted to realize measurement, but alternating-current impedance measurement is required to be performed by using a large impedance measuring apparatus with larger size and higher power consumption, on one hand, the cost of a measuring system may be increased, and on the other hand, the size and power consumption of the overall measuring system may be greatly increased, and requirements for small size and low power consumption required by applying an internet-of-things sensor may not be met. The increment of the measuring frequency further brings about the problem of great reduction of impedance measuring precision, and for many impedance measuring devices, the measuring precision under the measuring frequency of 408.35 kHz required by $Z_2$ will be remarkably lower than the impedance measuring precision under the measuring frequency of 1 kHz required by $Y_2$. Therefore, the signal-to-noise ratio (about 20480) of $Y_2$ serving as the measuring feature is much greater than the signal-to-noise ratio (about 1750) of $Z_2$ serving as the measuring feature.

Figure 7:
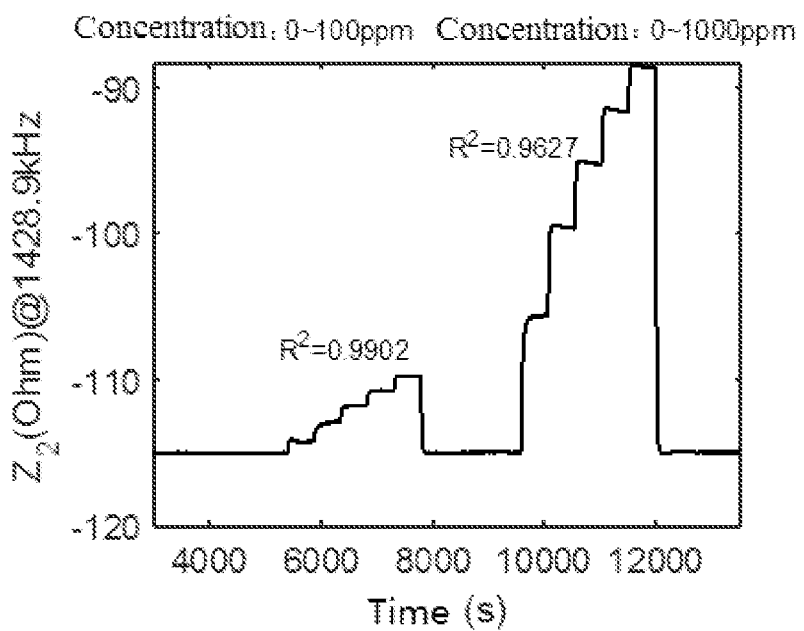
FIG. 7(a) to FIG. 7(b) are respectively diagrams showing gas concentration-measuring feature linearity relationships for gases within the different concentration ranges when $Z_2$ and $Y_2$ are respectively adopted as the measuring features, wherein a commercial semiconductor gas sensor TGS2600 is adopted herein, a to-be-detected gas is acetone (with concentration of 0-100 ppm: 20 ppm, 40 ppm, 60 ppm, 80 ppm and 100 ppm; and concentration of 0-1000 ppm: 200 ppm, 400 ppm, 600 ppm, 800 ppm and 1000 ppm), the ambient humidity is 37% RH, and the temperature is 28 DEG C.
Figure 7:
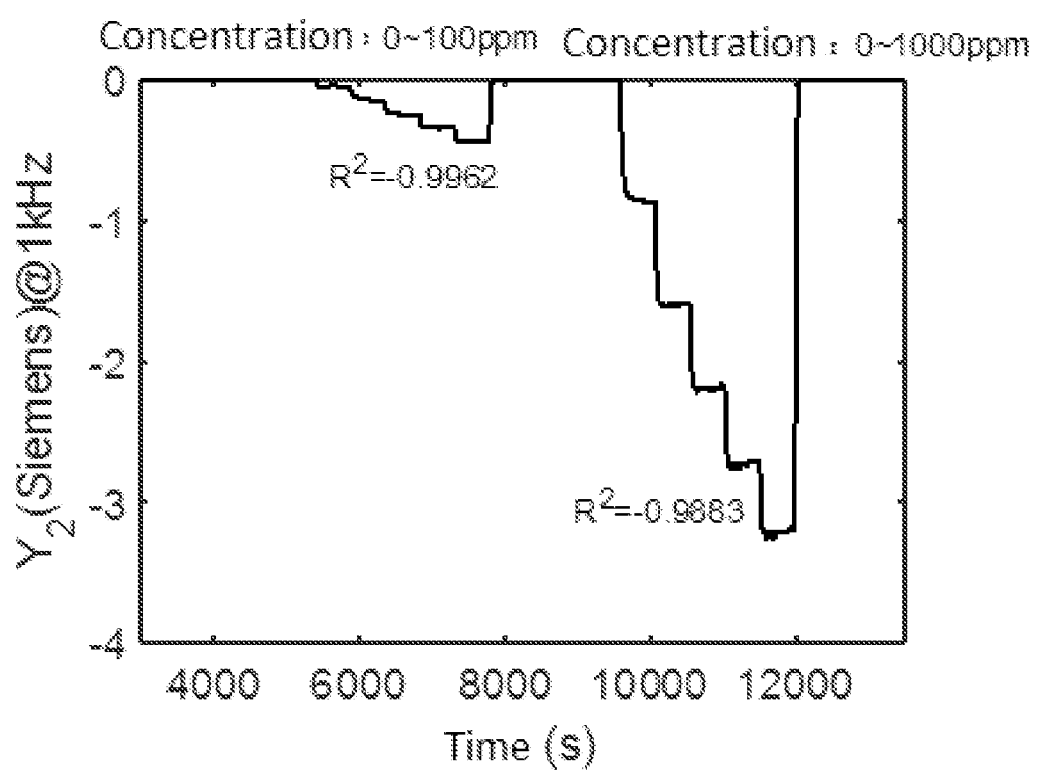

In FIG. 7(a) to FIG. 7(b), performances of $Z_2$ and $Y_2$ respectively used as the measuring features for detecting the gases within the different concentration ranges are further compared. It may be seen that when the measuring frequency and the parallel capacitance value are kept to be constant, the absolute values of the gas concentration-measuring feature linearity coefficients of the gases detected by $Z_2$ within the concentration range of 0-100 ppm are 0.9902, and when gases with the concentrations of 0-1000 ppm are detected, the absolute values of the gas concentration-measuring feature linearity coefficients may be reduced to 0.9627, and therefore, the absolute values are obviously reduced; and when $Y_2$ is used as the measuring feature, the absolute values of the gas concentration-measuring feature linearity coefficients may be always maintained to be 0.985 or above. Therefore, when $Y_2$ is used as the measuring feature, the gases within the different concentration ranges may be maintained at the relatively high gas concentration-measuring feature linearity without changing the measuring frequency and the parallel capacitance value, but $Z_2$ does not have such capability.

Based on above, the choice of an appropriate alternating-current impedance feature serving as the measuring feature has a huge effect on the measuring performance, although $Y_2$ and $Z_2$ are used mathematically reciprocal to each other, when they are respectively used as the measuring features, the optimal measuring frequencies respectively corresponding to $Y_2$ and $Z_2$ are remarkably different, and therefore, the measuring performances are remarkably different. Compared with $Z_2$ serving as the measuring feature, $Y_2$ serving as the measuring feature has the advantages summarized as follows:

1) Under the condition that the same requirement for the gas concentration-measuring feature linearity is met, the optimal measuring frequency corresponding to $Y_2$ is remarkably lower than that required by $Z_2$. It means that when $Y_2$ is adopted as the measuring feature, since the measuring frequency is low, the impedance measuring chip with low price, small size and low power consumption may be adopted to execute the alternating-current impedance measuring function, and thus, the requirement of the internet of things for the gas sensor may be met; and when $Z_2$ is used as the measuring feature, since the required measuring frequency is high, the impedance measuring apparatus with high price, large size and high power consumption is required, and thus, the requirement of the internet of things for the gas sensor may not be met.

2) The signal-to-noise ratio obtained when $Y_2$ is used as the measuring feature is remarkably higher than that obtained when $Z_2$ is used as the measuring feature.

3) For the gases within the different concentration ranges, $Z_2$ is capable of achieving better linearity as long as the measuring frequency is adjusted, while $Y_2$ is capable of achieving better linearity without changing the measuring frequency, and therefore, for the measurement of gases within unknown concentration ranges, $Y_2$ is easier to achieve good linearity.

Although implementation solutions of the present invention are described above in combination with the accompanying drawings, the present invention is not limited to the above-mentioned specific implementation solutions and application fields, and the above-mentioned specific implementation solutions are merely illustrative, instructive and not restrictive. Various forms may be further made by the ordinary skill in the art under the enlightenment of the description and without departing from the protective scope of claims of the present invention, and these forms fall within the protective range of the present invention.

What is claimed is:

1. A measuring method for a semiconductor gas sensor based on alternating-current impedance, comprising the following steps:
   a first step, connecting the semiconductor gas sensor to a capacitor in parallel, wherein alternating-current impedance features are formed after the semiconductor gas sensor is connected to the capacitor in parallel, and the alternating-current impedance features comprise the following nine features,
   Y: a modulus value, obtained by alternating-current impedance measurement, of admittance,
   $X_1$: a reciprocal of a modulus value, obtained by alternating-current impedance measurement, of a real part of the admittance,
   G: a modulus value, obtained by alternating-current impedance measurement, of the real part of the admittance,
   Z: a modulus value, obtained by alternating-current impedance measurement, of impedance,
   $Z_1$: a modulus value, obtained by alternating-current impedance measurement, of a real part of the impedance,
   $Y_1$: a reciprocal of the modulus value, obtained by alternating-current impedance measurement, of the real part of the impedance,
   $Y_2$: a reciprocal of a modulus value, obtained by alternating-current impedance measurement, of an imaginary part of the impedance,
   phase: a phase obtained by alternating-current impedance measurement, and
   P: a reciprocal of the phase obtained by alternating-current impedance measurement;
   a second step, connecting an alternating-current impedance measuring device to the semiconductor gas sensor and the capacitor, wherein the semiconductor gas sensor measures a target type of gas with a known concentration according to the following way:
   combining measuring parameters under measuring frequencies within a first preset range and parallel capacitance values within a second preset range, and measuring a certain type of gas with the known concentration according to each of the nine features under each combination;
   after each measurement is ended, obtaining a feature value corresponding to the known concentration under a currently selected certain feature in the nine features;
   traversing all parameter combinations and all the nine features to obtain a plurality of feature values corresponding to the same gas concentration under each feature;
   in the case that the linearity and signal-to-noise ratio of each of the feature values of all kinds of the features and the known concentration are simultaneously taken into consideration, the linearity is enabled to be greater than or equal to a first threshold and the signal-to-noise ratio is enabled to be greater than or equal to a second threshold:
   selecting measuring frequencies within a third range adopting a frequency range formed by corresponding frequency values, wherein a lower limit of the third range is the minimum frequency in the corresponding frequency values, and an upper limit of the third range is the maximum frequency in the corresponding frequencies,
   selecting parallel capacitance values within a fourth range adopting a capacitance range formed by corresponding parallel capacitance values, wherein a lower limit of the fourth range is the minimum capacitance value in the corresponding parallel capacitance values, and an upper limit of the fourth range is the maximum capacitance value in the corresponding parallel capacitance values,
   selecting a certain or several of the corresponding features, and
   taking the selected measuring frequencies within the third range, the selected parallel capacitance values within the fourth range and the selected certain or several of the corresponding features as finally selected measuring parameters for measuring an unknown gas concentration; and a third step, measuring the type of gas with an unknown concentration based on the measuring parameters.

2. The method according to claim 1, wherein the step that the linearity and signal-to-noise ratio of each of the feature values of all kinds of the features and the known concentration are simultaneously taken into consideration, the linearity is enabled to be greater than or equal to a first threshold and the signal-to-noise ratio is enabled to be greater than or equal to a second threshold comprises:

1) firstly, screening all the feature values with the linearity being greater than or equal to the first threshold and each of the features corresponding to the feature values; and then, further selecting the feature values with the signal-to-noise ratios being greater than or equal to the second threshold and each of the features corresponding to the feature values from the feature values;

or, 2) firstly, screening all the feature values with the signal-to-noise ratios being greater than or equal to the second threshold and each of the features corresponding to the feature values; and then, further selecting the feature values with the linearity being greater than or equal to the first threshold and each of the features corresponding to the feature values from the feature values.

3. The method according to claim 1, wherein in the first step, the semiconductor gas sensor is connected to a heating voltage, and the semiconductor gas sensor comprises a metal oxide gas sensor.

4. The method according to claim 1, wherein in the second step, the first preset range is 1 Hz to 100 MHz, and the second preset range is 0 pF to 100 uF.

5. The method according to claim 1, wherein in the second step, the alternating-current impedance measuring device comprises an impedance analyzer, a vector network analyzer, an electrical bridge, an impedance measuring chip and other apparatuses with impedance measuring functions.

6. The method according to claim 1, wherein in the second step, measuring precision is further inspected as another dimension for finally selecting the measuring parameters for measuring the unknown gas concentration.

7. The method according to claim 6, wherein a strategy for determining the measuring parameters represented by the measuring frequencies within the third range, the parallel capacitance values within the fourth range and the features is that: firstly, the feature values with the linearity being greater than or equal to the first threshold are selected, then, the feature values with the signal-to-noise ratios being greater than or equal to the second threshold and the features corresponding to the feature values are screened from the feature values, and finally, the feature values with the measuring frequencies being located within the optimal measuring precision range of the impedance measuring device are selected and taken as the finally screened feature values, the measuring frequencies within the third range adopting a frequency range formed by the frequency values corresponding to the finally screened feature values are selected, the parallel capacitance values within the fourth range adopting a capacitance range formed by the parallel capacitance values corresponding to the finally screened feature values are selected, a certain or several of the corresponding features are selected, and the selected measuring frequencies within the third range, the selected parallel capacitance values within the fourth range and the selected certain or several of the corresponding features are taken as the finally selected measuring parameters for measuring the unknown gas concentration.

8. The method according to claim 6, wherein another strategy for determining the measuring parameters represented by the measuring frequencies within the third range, the parallel capacitance values within the fourth range and the features is that: firstly, the feature values with the signal-to-noise ratios being greater than or equal to the second threshold are selected, then, the feature values with the linearity being greater than or equal to the first threshold and the features corresponding to the feature values are screened from the feature values, and finally, the feature values with the measuring frequencies being located within the optimal measuring precision range of the impedance measuring device are selected and taken as the finally screened feature values, the measuring frequencies within the third range adopting a frequency range formed by the frequency values corresponding to the finally screened feature values are selected, the parallel capacitance values within the fourth range adopting a capacitance range formed by the parallel capacitance values corresponding to the finally screened feature values are selected, a certain or several of the corresponding features are selected, and the selected measuring frequencies within the third range, the selected parallel capacitance values within the fourth range and the selected certain or several of the corresponding features are taken as the finally selected measuring parameters for measuring the unknown gas concentration.

* * * * *